US008513357B2

(12) United States Patent
Nishijima

(10) Patent No.: US 8,513,357 B2
(45) Date of Patent: *Aug. 20, 2013

(54) ETHYLENE COPOLYMER COMPOSITION, SHEET FOR SEALING A SOLAR CELL ELEMENT, AND SOLAR CELL MODULE

(75) Inventor: Koichi Nishijima, Ichihara (JP)

(73) Assignee: Du Pont-Mitsui Polychemicals Co., Ltd., Tokyo (JP)

(*) Notice: Subject to any disclaimer, the term of this patent is extended or adjusted under 35 U.S.C. 154(b) by 254 days.

This patent is subject to a terminal disclaimer.

(21) Appl. No.: 12/999,015

(22) PCT Filed: Jun. 16, 2009

(86) PCT No.: PCT/JP2009/060965
§ 371 (c)(1), (2), (4) Date: Dec. 14, 2010

(87) PCT Pub. No.: WO2009/154209
PCT Pub. Date: Dec. 23, 2009

(65) Prior Publication Data
US 2011/0105681 A1    May 5, 2011

(30) Foreign Application Priority Data
Jun. 20, 2008  (JP) ................................ 2008-161494

(51) Int. Cl.
C08F 8/32        (2006.01)
C08F 220/06    (2006.01)
H01L 31/048    (2006.01)

(52) U.S. Cl.
USPC .......... 525/102; 525/329.9; 525/342; 136/259

(58) Field of Classification Search
None
See application file for complete search history.

(56) References Cited

U.S. PATENT DOCUMENTS

| 5,527,619 | A  | * | 6/1996  | Rokowski et al. | 428/452 |
| 6,177,493 | B1 | * | 1/2001  | Maver | 524/188 |
| 2011/0108094 | A1 | * | 5/2011 | Nishijima et al. | 136/251 |
| 2011/0272026 | A1 | * | 11/2011 | Nishijima | 136/259 |

FOREIGN PATENT DOCUMENTS

| CN | 101138095 A | 3/2008 |
| EP | 1863098 | * 12/2007 |
| JP | 2000-186114 | 7/2000 |
| JP | 2001-144313 | 5/2001 |
| JP | 2004-031445 | 1/2004 |
| JP | 2006-036875 A | 2/2006 |
| JP | 2006-190867 | 7/2006 |
| JP | 2009-177089 | 8/2009 |
| WO | 2006-095762 | 9/2006 |
| WO | 2008-078801 | 7/2008 |

OTHER PUBLICATIONS

Gelest Silane Coupling Agents product literature; 2006; pp. 1-58.*
International Search Report dated Sep. 29, 2009.
First Office Action against a same family Japanese Application No. 2009-54520 mailed on Jan. 19, 2010.
Decision of Refusal a same family Japanese Application No. 2009-54520 mailed on May 11, 2010.
Second Office Action against a same family Japanese Application No. 2009-54520 mailed on Sep. 7, 2010.
Chinese Patent Office Action issued Aug. 20, 2012 and the Portion of the English Translation Thereof (Chinese Patent Application No. 200980123199.4), 10 pages.
German Patent Office Action issued Oct. 31, 2012 and the English Translation thereof (German Patent Application No. 112009001580.8), 8 pages.

* cited by examiner

*Primary Examiner* — David Buttner
(74) *Attorney, Agent, or Firm* — Rankin, Hill & Clark LLP

(57) ABSTRACT

An ethylene copolymer composition which includes a zinc ionomer containing, as a main component, a copolymer having a constituent unit derived from ethylene and a constituent unit derived from (meth)acrylic acid, and a dialkoxysilane having an amino group, is provided. This makes it possible to increase the stability during sheet production. It is preferable that the content ratio of the dialkoxysilane is 15 parts by mass or less based on 100 parts by mass of the zinc ionomer.

13 Claims, No Drawings

US 8,513,357 B2

ETHYLENE COPOLYMER COMPOSITION, SHEET FOR SEALING A SOLAR CELL ELEMENT, AND SOLAR CELL MODULE

TECHNICAL FIELD

The present invention relates to an ethylene copolymer composition suitable for a solar cell sealing purpose intended for fixing a solar cell element in a solar cell module, and a sheet for sealing a solar cell element and a solar cell module using the ethylene copolymer composition.

BACKGROUND ART

Hydroelectric power generation, wind-power generation, photovoltaic power generation and the like, which can be used to attempt to reduce carbon dioxide or improve other environmental problems by using inexhaustible natural energy, have received much attention. Among these, photovoltaic power generation has seen a remarkable improvement in performance such as the power generation efficiency of solar cell modules, and an ongoing decrease in the price, and national and local governments have worked on projects to promote the installation of residential photovoltaic power generation systems. Thus, in recent years, spread of photovoltaic power generation systems has advanced considerably.

Photovoltaic power generation directly converts solar energy to electric energy using a silicon cell semiconductor (solar cell element). The solar cell element as used herein undergoes a decrease in function when directly brought into contact with air from the outside. Therefore, a solar cell element is placed between sealing materials so as to provide a buffer as well as to prevent incorporation of foreign materials or infiltration of moisture. This sealing material is required to have various performance criteria, such as that the material is transparent and does not inhibit the power generation by light (transparency), that the material does not elute or disintegrate under the action of heat (heat resistance), that the material has good adherence to a protecting material such as glass or a back sheet (adhesiveness), and that the material does not undergo significant deterioration or yellowing under sunlight (durability). Thus, in order to satisfy these requirements, various formulations of blending in various components have been investigated. For example, there is known, as a representative formulation with consideration for transparency, heat resistance, adhesiveness, flexibility, moldability, durability and the like, a mixture of an ethylene-vinyl acetate copolymer combined with a peroxide and a silane coupling agent is used as a solar cell sealing material (see, for example, Patent Document 1).

Such a solar cell sealing material needs to employ a two-step process including a step of producing a sheet of an ethylene-vinyl acetate copolymer with various additives incorporated, and a step of sealing a solar cell element using the sheet thus obtained. In this step of producing a sheet, since it is necessary to perform molding at a low temperature at which the organic peroxide included for crosslinking does not undergo decomposition, the extrusion molding speed cannot be increased. Furthermore, in the step of sealing a solar cell element, it is necessary to perform an adhesion process which takes time and has two steps, including a step of performing temporary bonding in a laminator over several minutes to several tens of minutes, and a step of performing main bonding in an oven at a high temperature at which the organic peroxide is decomposed for several tens of minutes to one hour. Therefore, the production of a solar cell module requires effort and time, and also is one contributory factor for increasing the production cost.

In light of such circumstances, investigations are being undertaken on substitute materials which do not require the use of an organic peroxide such as described above, can significantly improve the production efficiency for solar cell modules, and have excellent characteristics as sealing materials for solar cells. Specifically, there has been suggested a solar cell element sealing material using an ethylene-unsaturated carboxylic acid copolymer having an unsaturated carboxylic acid content of 4 mass % or more and a melting point of 85° C. or higher, or an ionomer thereof (see, for example, Patent Document 2).

Furthermore, a press sheet has been disclosed, which is obtained by performing press molding using, as a sealing material that constitutes a solar cell module, an ethylene copolymer composition containing an ethylene-methacrylic acid copolymer and an amino group-containing trimethoxysilane at a predetermined ratio (see, for example, Patent Documents 3 and 4).

On the other hand, a solar cell uses various backing films on the side opposite to side of the solar cell element where sunlight is incident, and the amount of addition of a silane coupling agent in the sealing material may be increased in order to adjust the adhesiveness to the backing films Patent Document 1: WO 2006/095762 A1
Patent Document 2: Japanese Patent Application Laid-Open (JP-A) No. 2000-186114
Patent Document 3: JP-A No. 2004-31445
Patent Document 4: JP-A No. 2001-144313

DISCLOSURE OF THE INVENTION

Problem to be Solved by the Invention

However, when attempts are made to increase the amount of addition of the silane coupling agent, there is a concern that silanol condensation between the silane coupling agent molecules occurs during the sheet production, and a gel-like matter is generated in the sheet, thereby productivity being impaired. With the described ethylene copolymer composition, the level of performance for sheet molding with stability as such is insufficient.

The present invention was made in view of such circumstances. Under such circumstances, there is a need for an ethylene copolymer composition having excellent stability during sheet production, and an ethylene copolymer composition which may be molded easily and in a short time as compared with the conventional ethylene copolymer compositions, without requiring any crosslinking by an organic peroxide or the like, and is suitable for the application for sealing solar cell elements.

Furthermore, there is a need for a sheet for sealing a solar cell element which has high adhesiveness to a base material such as a glass substrate or a back sheet, and may be molded easily and in a short time as compared with conventional sheets, without requiring any crosslinking by an organic peroxide or the like.

There is also a need for a solar cell module which may be produced easily and in a short time as compared with the conventional solar cell modules and has improved durability.

Means for Solving the Problem

The invention was achieved based on the finding that a constitution combining an ethylene-based copolymer and a specific silane coupling agent in a specific range has more stable sheet moldability, while maintaining the excellent performance of the ethylene copolymer composition, particularly transparency, heat resistance, adhesiveness, flexibility, moldability, durability and the like thereof.

Specific means for achieving the objects described above are as follows. A first aspect of the invention is an ethylene copolymer composition including a zinc ionomer containing, as a main component, a copolymer having a constituent unit derived from ethylene and a constituent unit derived from (meth)acrylic acid, and a dialkoxysilane having an amino group. The copolymer in the zinc ionomer may further have a constituent unit derived from a monomer other than ethylene and (meth)acrylic acid (for example, a (meth)acrylic acid ester).

According to the first aspect of the invention, a preferred embodiment is an ethylene copolymer composition in which the dialkoxysilane is at least one of 3-aminopropylalkyl-dialkoxysiane or N-2-(aminoethyl)-3-aminopropylalkyl-dialkoxysilane. Among them, a dialkoxysilane containing an alkyl moiety having from 1 to 3 carbon atoms is preferable.

According to the first aspect of the invention, a preferred embodiment is an ethylene copolymer composition in which the dialkoxysilane is contained in an amount in the range of 15 parts by mass or less based on 100 parts by mass of the zinc ionomer. Furthermore, it is preferable that a content ratio of the dialkoxysilane is from 0.03 parts by mass to 12 parts by mass based on 100 parts by mass of the zinc ionomer.

According to the first aspect of the invention, a preferred embodiment is an ethylene copolymer composition further containing a weather resistance stabilizer selected from a group consist of an ultraviolet absorber, a photostabilizer or an antioxidant.

According to the first aspect of the invention, it is preferable that the copolymer in the zinc ionomer further has a constituent unit derived from a (meth)acrylic acid ester. It is also preferable that the content ratio of the constituent unit derived from (meth)acrylic acid is from 1% by mass to 25% by mass based on the total mass of the copolymer.

It is preferable that the degree of neutralization of the zinc ionomer is from 10% to 60%.

A second aspect of the invention is a sheet for sealing a solar cell element formed by using the ethylene copolymer composition of the first aspect of the invention.

A third aspect of the invention is a solar cell module equipped with the sheet for sealing a solar cell element of the second aspect of the invention.

Effect of the Invention

According to the invention, an ethylene copolymer composition having excellent stability during sheet production may be provided. Furthermore, an ethylene copolymer composition which may be molded easily and in a short time as compared with the conventional ethylene copolymer compositions, without requiring any crosslinking by an organic peroxide or the like, and is suitable for the application for sealing solar cell elements may be provided.

Furthermore, according to the invention, there may be provided a sheet for sealing a solar cell element which has high adhesiveness to a base material such as a glass substrate or a back sheet, and may be molded easily and in a short time as compared to the conventional sheets for sealing a solar cell element, without requiring any crosslinking by an organic peroxide.

According to the invention, there also may be provided a solar cell module which may be produced simply and in a short time as compared with conventional solar cell modules and which has improved durability.

BEST MODE FOR CARRYING OUT THE INVENTION

Hereinafter, the ethylene copolymer composition of the invention, and the sheet for sealing a solar cell element and the solar cell module, which use the ethylene copolymer composition, will be described in detail.

The ethylene copolymer composition of the invention is composed by mixing a zinc ionomer (hereinafter, also referred to as "zinc ionomer according to the invention") which contains, as a main component, a copolymer (hereinafter, also referred to as "ethylene (meth)acrylic acid-based copolymer") containing a constituent unit derived from ethylene and a constituent unit derived from (meth)acrylic acid, with a dialkoxysilane having an amino group. Preferably, the ethylene copolymer composition of the invention is composed by mixing 15 parts by mass or less of the dialkoxysilane having an amino group, with 100 parts by mass of the zinc ionomer.

Since a zinc ionomer containing an ethylene-(meth)acrylic acid-based copolymer as a main component is used in the invention, the invention has excellent transparency, heat resistance, adhesiveness, flexibility, moldability, durability and the like, and stable sheet production may be achieved since the generation of a gel-like matter in the system containing a silane coupling agent is prevented, while maintaining these properties to a high degree. Furthermore, a crosslinking process using an organic peroxide or the like is made unnecessary so that molding may be performed in a short time by a easy method as compared with conventional methods, and at the same time, a suitable product for the application for sealing solar cell elements is obtained.

The phrase "containing a copolymer as a main component" means that the proportion occupied by the "copolymer containing a constituent unit derived from ethylene and a constituent unit derived from (meth)acrylic acid" in the total mass of the resin component in the zinc ionomer according to the invention is 80% by mass or more.

One advantage of using such an ionomer is that transparency and the storage elastic modulus at high temperature are high. The degree of neutralization (degree of neutralization of the acid groups in the ionomer) is, for example, preferably 80% or less, but in view of adhesiveness and the like, a degree of neutralization that is not excessively high is preferred. Specifically, the degree of neutralization is preferably 60% or less, and particularly preferably 30% or less. The lower limit of the degree of neutralization is preferably 10%, from the viewpoint of adhesiveness.

According to the invention, when a zinc ionomer containing an ethylene-(meth)acrylic acid-based copolymer as a main component is used, it is preferable, from the viewpoint of the transparency of the copolymer composition thus obtainable, and the adhesiveness to a base material such as glass or a back sheet, that the content (copolymerization ratio) of (meth)acrylic acid is 1% by mass or more based on the total mass of the ethylene-(meth)acrylic acid-based copolymer. When the content of (meth)acrylic acid is increased, a product superior in transparency is obtained, but there may be problems such as lowered melting point or increased hygroscopic properties. Thus, the content of (meth)acrylic acid (copolymerization ratio) is preferably 25% by mass or less, and more preferably 20% by mass or less, based on the total mass of the ethylene-(meth)acrylic acid-based copolymer.

The zinc ionomer according to the invention contains a zinc ion as a metal ion, and therefore, the zinc ionomer has excellent weather resistance compared with those ionomers containing other metal ions such as Na. Also, as the ionomer is combined with a specific silane coupling agent defined by the invention, generation of a gel-like matter, foaming and the like during the sheet production process is suppressed, and stability during the sheet production is enhanced.

The melting point of the zinc ionomer according to the invention is preferably 55° C. or higher, more preferably 60° C. or higher, and particularly preferably 70° C. or higher. When the melting point of the zinc ionomer is 55° C. or higher, heat resistance is improved, and when the composition is used in a sealing(encapsulating) material for solar cell elements, the deformation due to an increase in temperature is suppressed during the use of a solar cell. Furthermore, when a solar cell module is to be produced by a hot press method, the sealing material does not flow out more than necessary, and the generation of burrs is also prevented.

Regarding the zinc ionomer according to the invention, the melt flow rate (MFR; hereinafter, the same) at 190° C. under a load of 2160 g according to JIS K7210-1999 is preferably 1 g/10 min to 100 g/10 min, and particularly preferably 5 g/10 min to 50 g/10 min, in view of the molding processability, mechanical strength and the like.

The ethylene-(meth)acrylic acid-based copolymer in the zinc ionomer according to the invention may be copolymerized with another monomer other than ethylene and (meth)acrylic acid. For example, when a vinyl ester, a (meth)acrylic acid ester or the like is copolymerized as the other monomer, an effect of imparting flexibility may be obtained. Among them, a (meth)acrylic acid ester is preferred. The (meth)acrylic acid ester is preferably an ester of (meth)acrylic acid with a lower alkyl group having from 2 to 5 carbon atoms, and more preferably an ester of (meth)acrylic acid with an alkyl having 4 carbon atoms, such as isobutyl or n-butyl. Specific examples include ester compounds such as methyl acrylate, ethyl acrylate, isopropyl acrylate, isobutyl acrylate, n-butyl acrylate, isooctyl acrylate, methyl methacrylate, isobutyl methacrylate and dimethyl maleate. Among them, lower alkyl esters (carbon number 2 to 5) of acrylic acid or methacrylic acid, such as methyl acrylate, ethyl acrylate, isopropyl acrylate, isobutyl acrylate, n-butyl acrylate, methyl methacrylate, and isobutyl methacrylate, are preferred. Moreover, n-butyl ester or isobutyl ester of acrylic acid or methacrylic acid is preferred, and among others, an ester of acrylic acid with an alkyl having 4 carbon atoms is preferred, while isobutyl ester is particularly preferred.

The copolymerization ratio of the other monomer may be appropriately selected so as not to impair the purpose of the invention.

The ethylene-(meth)acrylic acid-based copolymer according to the invention can be obtained by radical copolymerization under high temperature and high pressure. The zinc ionomer of the ethylene-(meth)acrylic acid-based copolymer can be obtained by reacting an ethylene-(meth)acrylic acid-based copolymer with zinc acetate or zinc oxide.

Examples of the "dialkoxysilane having an amino group" that is mixed into the ethylene copolymer composition of the invention include N-2-(aminoethyl)-3-aminiopropylalkyl-dialkoxysilanes such as N-2-(aminoethyl)-3-aminopropylmethyldimethoxysilane and N-2-(aminoethyl)-3-aminopropylmethyldiethoxysilane; 3-aminopropylalkyldialkoxysilanes such as 3-aminopropylmethyldimethoxysilane and 3-aminopropylmethyldiethoxysilane; N-phenyl-3-aminopropylmethyldimethoxysilane, and N-phenyl-3-aminopropylmethyldiethoxysilane.

Among these, N-2-(aminoethyl)-3-aminopropylalkyldialkoxysilane (more preferably, with an alkyl moiety having from 1 to 3 carbon atoms) or 3-aminopropylalkyldialkoxysilane (more preferably with an alkyl moiety having from 1 to 3 carbon atoms) is preferred, and among them, particularly N-2-(aminoethyl)-3-aminopropylmethyldimethoxysilane, N-2-(aminoethyl)-3-aminopropylmethyldiethoxysilane, 3-aminopropylmethyldimethoxysilane, and 3-aminopropylmethyldiethoxysilane are preferred. In particular, N-2-(aminoethyl)-3-aminopropylmethyldimethoxysilane is easily available at low cost in the market, and is therefore preferable.

When a trialkoxysilane is used as a silane coupling agent in the ethylene copolymer composition, the viscosity increase is large, the composition is likely to turn into a gel-like matter, and the adhesiveness decreases relatively rapidly during storage. However, when a dialkoxysilane is used as a silane coupling agent as in the present invention, viscosity increase or gelation during the sheet production process is suppressed, and the composition is stabilized and maintains adhesiveness. Thus, the adhesion processing to a base material such as glass or a back sheet can be performed in a stable manner.

The dialkoxysilane having an amino group is mixed at a proportion of 15 parts by mass or less, preferably from 0.03 parts by mass to 12 parts by mass, and particularly preferably from 0.05 parts by mass to 12 parts by mass, based on 100 parts by mass of the zinc ionomer according to the invention, from the viewpoint of the effect of improving the adhesiveness to the base materials (glass, back sheet or the like) that include a solar cell element therebetween, and from the viewpoint of stability such as suppression of the generation of, for example, a gel-like matter during sheet molding. The optimal range is adjusted within the range described above because the circumstances for generation of a gel-like matter changes with the thermal history or the like. However, generally when the amount of the dialkoxysilane having an amino group exceeds 15 parts by mass, good adhesiveness is not obtainable by a conventional molding processing method, and sheet molding cannot be stably achieved due to the generation of a gel-like matter.

It is also effective, from the view point of preventing the deterioration of the sealing material due to ultraviolet rays in sunlight, to incorporate at least one weather resistance stabilizer such as an antioxidant, a photostabilizer or an ultraviolet absorber, into the ethylene copolymer composition of the invention.

For example, various hindered phenol-based and phosphite-based agents can be suitably used as the antioxidant. Specific examples of the hindered phenol-based antioxidant include a 2,6-di-t-butyl-p-cresol, a 2-t-butyl-4-methoxyphenol, a 3-t-butyl-4-methoxyphenol, a 2,6-di-t-butyl-4-ethylphenol, a 2,2'-methylenebis(4-methyl-6-t-butylphenol), a 2,2'-methylenebis(4-ethyl-6-t-butylphenol), a 4,4'-methylenebis(2,6-di-t-butylphenol), a 2,2'-methylenebis[6-(1-methylcyclohexyl)-p-cresol], a bis[3,3-bis(4-hydroxy-3-t-butylphenyl)butyric acid] glycol ester, a 4,4'-butylidenebis(6-t-butyl-m-cresol), a 2,2'-ethylidenebis(4-sec-butyl-6-t-butylphenol), a 2,2'-ethylidenebis(4,6-di-t-butylphenol), an 1,1,3-tris(2-methyl-4-hydroxy-5-t-butylphenyl)butane, an 1,3,5-tris(3,5-di-t-butyl-4-hydroxybenzyl)-2,4,6-trimethylbenzene, a 2,6-diphenyl-4-octadecyloxyphenol, a tetrakis[methylene-3-(3,5-di-t-butyl-4-hydroxyphenyl) propionate] methane, a n-octadecyl-3-(3,5-di-t-butyl-4-hydroxyphenyl) propionate, a 4,4'-thiobis(6-t-butyl-m-cresol), a tocopherol, a 3,9-bis[1,1-dimethyl-2-[β-(3-(3-t-butyl-4-hydroxy-5-methylphenyl)propionyloxy]ethyl]2,4,8,10-tetraoxaspiro[5,5]undecane, a 2,4,6-tris(3,5-di-t-butyl-4-hydroxybenzylthio)-1,3,5-triazine, and the like.

Furthermore, specific examples of the phosphite-based antioxidant include a 3,5-di-t-butyl-4-hydroxybenzylphosphanate dimethyl ester, an ethyl bis(3,5-di-t-butyl-4-hydroxybenzylphosphonate, a tris(2,4-di-t-butylphenyl) phosphanate, and the like.

As the photostabilizer, for example, hindered amine-based agents can be suitably used. Examples of the hindered amine-based photostabilizers include a 4-acetoxy-2,2,6,6-tetramethylpiperidine, a 4-stearoyloxy-2,2,6,6-tetramethylpiperidine, a 4-acryloyloxy-2,2,6,6-tetramethylpiperidine, a 4-benzoyloxy-2,2,6,6-tetramethylpiperidine, a 4-cyclohexanoyloxy-2,2,6,6-tetramethylpiperidine, a 4-(o-chlorobenzoyloxy)-2,2,6,6-tetramethylpiperidine, a 4-(phenoxyacetoxy)-2,2,6,6-tetramethylpiperidine, an 1,3,8-triaza-7,7,9,9-tetramethyl-2,4-dioxo-3-n-octylspiro[4,5]decane, a bis(2,2,6,6-tetramethyl-4-piperidyl) sebacate, a bis(2,2,6,6-tetramethyl-4-piperidyl) terephthalate, a bis(1,2,2,6,6-pentamethyl-4-piperidyl) sebacate, a tris(2,2,6,6-tetramethyl-4-piperidyl)benzene-1,3,5-tricarboxylate, a tris(2,2,6,6-tetramethyl-4-piperidyl)-2-acetoxypropane-1,2,3-tricarboxylate, a tris(2,2,6,6-tetramethyl-4-piperidyl) 2-hydroxypropane-1,2,3-tricarboxylate, a tris(2,2,6,6-tetramethyl-4-piperidyl)triazine-2,4,6-tricarboxylate, a tris(2,2,6,6-tetramethyl-4-piperidine) phosphite, a tris(2,2,6,6-tetramethyl-4-piperidyl)butane-1,2,3-tricarboxylate, a tetrakis (2,2,6,6-tetramethyl-4-piperidyl)propane-1,1,2,3-tetracarboxylate, a tetrakis(2,2,6,6-tetramethyl-4-piperidyl) butane-1,2,3,4-tetracarboxylate, and the like.

Examples of the ultraviolet absorber include benzophenone-based agents such as a 2-hydroxy-4-methoxybenzophenone, a 2,2'-dihydroxy-4-methoxybenzophenone, a 2-hydroxy-4-methoxy-2-carboxybenzophenone, and a 2-hydroxy-4-n-octoxybenzophenone; benzotriazole-based agents such as a 2-(2'-hydroxy-3',5'-di-tertiary-butylphenyl) benzotriazole, a 2-(2'-hydroxy-5-methylphenyl)benzotriazole, and a 2-(2'-hydroxy-5-tertiary-octylphenyl)benzotriazole; and salicylic acid ester-based agents such as a phenyl salicylate, a p-octylphenyl salicylate, and the like.

It is effective to mix these weather resistance stabilizers at a proportion of 5 parts by mass or less, and particularly 0.1 parts by mass to 3 parts by mass, based on 100 parts by mass of the zinc ionomer according to the invention.

The ethylene copolymer composition of the invention may be mixed with any other additives to an extent of not impairing the purpose of use or the effects of the invention. As the other additives, various known additives may be used.

Examples of the other additives include a pigment, a dye, a lubricant, a discoloration preventing agent, an anti-blocking agent, a foaming agent, an auxiliary foaming agent, a crosslinking agent, a crosslinking aid, an inorganic filler, and the like.

When the ethylene copolymer composition of the invention is used as a solar cell sealing(encapsulating) material, for example, fatty acid salts of metals such as cadmium and barium can be incorporated as the discoloration preventing agent.

When the ethylene copolymer composition is used as a sealing material on the side opposite to side where sunlight is incident, that is, on the side where a lower part protecting material such as a so-called back sheet is disposed, transparency is not demanded, and therefore, a pigment, a dye, an inorganic filler and the like may be incorporated for the purpose of a coloration and an enhancement of a power generation efficiency. For example, white pigments such as titanium oxide and calcium carbonate; blue pigments such as ultramarine blue; black pigments such as carbon black, as well as glass beads and a light diffusing agent may be taken as examples. Particularly, when the ethylene copolymer composition of the invention is applied to a system where an inorganic pigment such as titanium oxide is incorporated, it is preferable in view of having an excellent effect of preventing a decrease in the insulating resistance. When a pigment, a dye, an inorganic filler and the like are incorporated, a suitable amount of incorporation of these (particularly, an inorganic pigment) is preferably 100 parts by mass or less, more preferably 0.5 parts by mass to 50 parts by mass, and particularly preferably 4 parts by mass to 50 parts by mass, based on 100 parts by mass of the zinc ionomer containing an ethylene-(meth)acrylic acid-based copolymer as a main component.

The ethylene copolymer composition of the invention can be used, for example, in the form of a sheet. The molding of sheets can be carried out according to a known method using a T-die extruder, a calendar molding machine, an inflation molding machine or the like. For example, a sheet is obtained by dry blending in advance a zinc ionomer containing an ethylene-(meth)acrylic acid-based copolymer as a main component, a dialkoxysilane having an amino group, and if necessary, an inorganic pigment and other additives that are added as necessary, supplying the blend to an extruder from its hopper, and if there are other components to be mixed, adding a master batch, subsequently heating the blend at, for example, 110° C. to 300° C., melt extruding the blend into a sheet form, and thereby laminating the sheet on a base material. The thickness of the sheet is not particularly limited, but is usually about 0.2 mm to 1.2 mm.

A solar cell module can be produced by disposing a solar cell element between two sheets of protecting base materials, disposing the sheet for sealing a solar cell element of the invention, for example, a sheet molded as described above (hereinafter, also referred to as a sealing material sheet), respectively between each of the protecting base material and the solar cell element, and fixing by heating and/or pressing. Such a solar cell module includes various types of modules. An example may include a solar cell module having a laminate structure, in which a solar cell element is sandwiched between sealing material sheets (ethylene copolymer composition of the invention) on both sides, such as in the structure of upper transparent protecting material on the side where sunlight is incident/sealing material sheet/solar cell element/ sealing material sheet/lower protecting material. In a solar cell module having such a constitution, it is preferable to use the sheet for sealing a solar cell element of the invention which does not contain an inorganic pigment as the sealing material on the side where an upper transparent protecting material is disposed, and to use a sheet for sealing a solar cell element of the invention which contains an inorganic pigment as the sealing material on the side where a lower protecting material is disposed.

Examples of a solar cell module of another type include a module having a constitution in which a solar cell element formed on the surface of a substrate such as glass is disposed between sealing materials on both sides of the solar cell element formed on the substrate, as in the case of upper transparent protecting material on the side where sunlight is incident/sealing material sheet/substrate having the solar cell element formed thereon/sealing material sheet/lower protecting material; and a module having a constitution in which a solar cell element formed on the inner peripheral surface of an upper transparent protecting material, for example, an amorphous solar cell element produced on glass or a fluororesin-based sheet by sputtering or the like, and a sealing material sheet and a lower protecting material are formed on the solar cell element.

The sealing material sheet formed from the ethylene copolymer composition of the invention has excellent moisture resistance. Generally, since a thin film type solar cell uses an electrode formed by depositing a metal film on a substrate, the solar cell tends to be vulnerable particularly to moisture. Therefore, it is one preferred embodiment to use the sealing material sheet of the invention in a thin film type solar cell. Specifically, it is a preferred embodiment to apply the sealing material sheet to a thin film type solar cell module having a constitution in which a sealing material sheet and a lower protecting material are formed on a solar cell element formed on the inner peripheral surface of an upper transparent protecting material.

Examples of the solar cell element include various solar cell elements, for example, silicon-based elements such as single crystal silicon, polycrystalline silicon, and amorphous silicon; and Group III-V or Group II-VI compound semiconductor-based elements such as gallium-arsenic, copper-indium-selenium, cadmium-tellurium, and the like. The sheet for sealing a solar cell element (ethylene copolymer composition) of the invention is particularly useful in the sealing of amorphous solar cell elements, for example, amorphous silicon, from the viewpoint of the durability of the adhesion with the two sheets of protecting base materials (upper transparent protecting material and lower protecting material described above).

Examples of the upper protecting material that constitutes the solar cell module include glass, an acrylic resin, polycarbonate, polyester, and a fluorine-containing resin, from the viewpoint that the upper protective material is the incident surface through which sunlight enters. Examples of the lower protecting material include single or multilayer sheets of metals or various thermoplastic resin films, and examples include single-layer or multilayer sheets made of an inorganic material such as metals such as tin, aluminum and stainless steel, glass and the like, polyester, inorganic-deposited polyester, a fluorine-containing resin, and polyolefin.

The sheet for sealing a solar cell element of the invention shows good adhesiveness to these upper protecting material and/or lower protecting material.

The production of a solar cell module may be carried out by heating the sheet for sealing a solar cell element of the invention at a temperature at which the sheet melts, over time as necessary, and adhering the sealing material sheet to the solar cell element or the protecting material by closely attaching them.

EXAMPLES

Hereinafter, the invention will be more specifically described based on Examples, but the invention is not intended to be limited to the following Examples, as long as the gist is maintained. Unless particularly stated otherwise, the unit "part" is on a mass basis.

—1. Raw Materials—

The following materials were prepared to carry out the Examples and Comparative Examples described below. The term "methacrylic acid content" means the copolymerization ratio of the repeating constituent unit derived from methacrylic acid, and the term "isobutyl acrylate content" means the copolymerization ratio of the repeating constituent unit derived from isobutyl acrylate. The MFR is the melt flow rate value measured according to JIS K7210-1999, at 190° C. under a load of 2160 g.

(1) Resin:
Resin (a): Zn ionomer of an ethylene-methacrylic acid copolymer
(Methacrylic acid content: 15% by mass, MFR: 5 g/10 min, degree of neutralization: 23%)
Resin (b): Zn ionomer of an ethylene-methacrylic acid copolymer
(Methacrylic acid content: 8.5% by mass, MFR: 5.5 g/10 min, degree of neutralization: 18%)
Resin (c): Ethylene-methacrylic acid copolymer
(Methacrylic acid content: 15% by mass, MFR: 25 g/10 min)
Resin (d): Ethylene-methacrylic acid copolymer
(Methacrylic acid content: 20% by mass, MFR: 60 g/10 min)
Resin (e): Na ionomer of an ethylene-methacrylic acid copolymer
(Methacrylic acid content: 15% by mass, MFR: 2.8 g/10 min, degree of neutralization: 30%)
Resin (f): Zn ionomer of an ethylene-isobutyl acrylate-methacrylic acid copolymer (Isobutyl acrylate content: 10% by mass, methacrylic acid content: 10% by mass, MFR: 9 g/10 min, degree of neutralization: 35%)

(2) Silane Coupling Agent:
Silane coupling agent (a): N-2-(aminoethyl)-3-aminopropylmethyldimethoxysilane
Silane coupling agent (b): N-2-(aminoethyl)-3-aminopropyltrimethoxysilane
Silane coupling agent (c): 3-Aminopropyltriethoxysilane
Silane coupling agent (d): 3-Glycidoxypropyltrimethoxysilane
Silane coupling agent (e): 3-Glycidoxypropylmethyldiethoxysilane (3) Antioxidant: Pentaerythritol tetrakis[3-(3,5-di-t-butyl-4-hydroxyphenyl) propionate] (IRGANOX 1010, manufactured by Ciba Specialty Chemicals, Inc.)

(4) Ultraviolet Absorber: 2-Hydroxy-4-n-octoxybenzophenone (CHIMASSORB 81, manufactured by Ciba Specialty Chemicals, Inc.)

(5) Photostabilizer: Bis(2,2,6,6-tetramethyl-4-piperidyl) sebacate (TINUVIN 770DF, manufactured by Ciba Specialty Chemicals, Inc.)

—2. Base Material—

The following two kinds of base materials were prepared.
(1) Float glass: thickness 3 mm, size 7.5 cm×12 cm
(2) Back sheet: Laminate base material of PVF (polyvinyl fluoride 38 μm in thickness)/PET (polyethylene terephthalate 75 μm in thickness)/PVF (polyvinyl fluoride 38 μm in thickness)
[PTD75 (fluororesin base material) manufactured by MA Packaging Co., Ltd.; PVF; TEDLAR (registered trademark) manufactured by Du Pont Company]

Example 1

70 g of the resin (a) and 0.7 g of the silane coupling agent (a) were respectively weighed and mixed in a LABO PLASTOMILL KNEADING MACHINE (manufactured by Toyo Seiki Seisaku-sho, Ltd., twin-screw) at 150° C. and a speed of rotation of 30 rpm for 15 minutes. The change in the torque [N·m] was monitored. The state of the mixture was also observed. During this process, the silane coupling agent was added after the resin torque had been stabilized after the resin feeding.

The change in torque, ΔN (%), was determined by the following formula, from the maximum value (Nmax) and the minimum value (Nmin) of torque. The results are shown in the following Table 1.

$$\Delta N[\%] = (N\max/N\min) \times 100 \qquad \text{Formula 5}$$

Next, the mixture thus obtained was press molded by a hot press method (150° C.) into a sheet having a thickness of 0.5 mm, and this sheet (sealing sheet) was laminated to float glass by a laminator under the conditions shown below. The laminated product thus obtained was cut to a sample having a width of 10 mm. The adhesive strength [N/10 mm] between the float glass and the sealing sheet was measured using a tensile tester at a tensile speed of 50 mm/min. The measurement results are shown in the following Table 1. An acceptable range of the adhesive strength between the float glass and the sealing sheet is 20 N/10 mm or greater.

<Pasting Conditions>

Pasting conditions: Pasting at 150° C.×10 min [After pressing for 1.5 minutes at an initial pressure of 1 MPa, pressing for 3.5 minutes under pressure at 10 MPa, and cooling for 5 minutes at 23° C.]

Pasting apparatus (laminator): LM-50×50S manufactured by NPC Corp.

Sample composition: Float glass/sealing sheet.

Example 2

A laminated product was obtained in the same manner as in Example 1, except that the resin (a) used in Example 1 was changed to resin (b), and measurements were also made. The measurement results are shown in the following Table 1.

Comparative Example 1

A laminated product was obtained in the same manner as in Example 1, except that the silane coupling agent (a) used in Example 1 was changed to silane coupling agent (b), and measurements were also made. The measurement results are shown in the following Table 1.

Comparative Example 2

A laminated product was obtained in the same manner as in Example 1, except that the silane coupling agent (a) used in Example 1 was changed to silane coupling agent (c), and measurements were also made. The measurement results are shown in the following Table 1.

Comparative Example 3

A laminated product was obtained in the same manner as in Example 1, except that the silane coupling agent (a) used in Example 1 was changed to silane coupling agent (d), and measurements were also made. The measurement results are shown in the following Table 1.

Comparative Example 4

A laminated product was obtained in the same manner as in Example 1, except that the silane coupling agent (a) used in Example 1 was changed to silane coupling agent (e), and measurements were also made. The measurement results are shown in the following Table 1.

Comparative Example 5

A laminated product was obtained in the same manner as in Example 1, except that the resin (a) used in Example 1 was changed to resin (b), and the silane coupling agent (a) was changed to silane coupling agent (c), and measurements were also made. The measurement results are shown in the following Table 1.

Comparative Example 6

A laminated product was obtained in the same manner as in Example 1, except that the resin (a) used in Example 1 was changed to resin (c), and the silane coupling agent (a) was changed to silane coupling agent (c), and measurements were also made. The measurement results are shown in the following Table 1.

Comparative Example 7

A laminated product was obtained in the same manner as in Example 1, except that the resin (a) used in Example 1 was changed to resin (c), and measurements were also made. The measurement results are shown in the following Table 1.

Comparative Example 8

A laminated product was obtained in the same manner as in Example 1, except that the resin (a) used in Example 1 was changed to resin (d), and the silane coupling agent (a) was changed to silane coupling agent (c), and measurements were also made. The measurement results are shown in the following Table 1.

Comparative Example 9

A laminated product was obtained in the same manner as in Example 1, except that the resin (a) used in Example 1 was changed to resin (d), and measurements were also made. The measurement results are shown in the following Table 1.

Comparative Example 10

A laminated product was obtained in the same manner as in Example 1, except that the resin (a) used in Example 1 was changed to resin (e), and the silane coupling agent (a) was changed to silane coupling agent (c), and measurements were also made. The measurement results are shown in the following Table 1.

Comparative Example 11

A laminated product was obtained in the same manner as in Example 1, except that the resin (a) used in Example 1 was changed to resin (e), and measurements were also made. The measurement results are shown in the following Table 1.

Example 3

A laminated product was obtained in the same manner as in Example 1, except that the amount of the silane coupling agent (a) added in Example 1 was changed from 1 part to 43 parts, and measurements were also made. The measurement results are shown in the following Table 1.

Example 4

100 kg of the resin (a) and 12 kg of the silane coupling agent (a) were respectively weighed and mixed, and the mixture was processed into impregnated pellets. The impregnated pellets thus obtained were kneaded at 150° C. using a twin-screw extruder (L/D 33, screw diameter 44 mm), and thus a pellet compound was obtained. During this process, the state of the compound was stabilized, and the generation of a particularly conspicuous gel-like matter was not observed even in the form of strands. Subsequently, the compound was processed into pellets, and the pellets thus obtained were pressed at 150° C. for 5 minutes (1.5 minutes at an initial pressure of 1 MPa+3.5 minutes under pressure at 10 MPa), and thus a press sheet having a thickness of 0.5 mm was produced. This press sheet was used and laminated to float glass using a laminator (LM-50×50S manufactured by NPC Corp.). The laminated product thus obtained was cut to a sample having a width of 10 mm, and the adhesive strength [N/10 mm] between the float glass and the sealing sheet was measured using a tensile tester at a tensile speed of 50 mm/min. As a result, the sample exhibited an adhesive strength of 60 N/10 mm or greater (sheet break).

Example 5

5000 g of the resin (a), 10 g of the silane coupling agent (a), 1 g of the antioxidant, 10 g of the ultraviolet absorber, and 3.5 g of the photostabilizer were respectively weighed and mixed, and the mixture was processed into impregnated pellets. The impregnated pellets thus obtained were kneaded at 180° C. using an extruder (L/D=26, full flight screw, compression ratio 2.6), and thus a uniform sheet (sealing sheet) having a thickness of 0.4 mm was obtained. The sealing sheet thus obtained was laminated to float glass and a back sheet using a laminator under the following conditions, and thus a laminated product was obtained. This laminated product was cut to a sample having a width of 10 mm, and the adhesive strengths [N/10 mm] between the back sheet and the sealing sheet and between the float glass and the sealing sheet were measured using a tensile tester at a tensile speed of 50 mm/min. Acceptable ranges of the adhesive strength between the back sheet and the sealing sheet, and acceptable ranges of the adhesive strength between the float glass and the sealing sheet are 5 N/10 mm or more, and 20 N/10 mm or more, respectively. The measurement results are shown in the following Table 2.
<Pasting Conditions>
Pasting conditions: Pasting at 150° C.×10 min [After pressing for 1.5 minutes at an initial pressure of 1 MPa, pressing for 3.5 minutes under pressure at 10 MPa, and cooling for 5 minutes at 23° C.]
Pasting apparatus (laminator): LM-50×50S manufactured by NPC Corp.
Sample composition: Float glass/sealing sheet/back sheet
The sample thus obtained was used to measure the initial yellow index, YI, using a color computer SM-T (manufactured by Suga Test Instruments Co., Ltd.). Subsequently, the sample was subjected to aging under the following environmental conditions according to the evaluation items, using Ci-4000 (manufactured by Atlas Material Testing Technology LLC), and then the YI was measured again in the same manner as described above. The degree of yellowing was compared by comparing the YI value with the initial YI value, and thus durability was evaluated. A smaller change in the YI values measured before and after aging means excellent durability. The results of the measurement and evaluation are shown in the following Table 2.
<Evaluation Items and Environmental Conditions>
Heat resistance: 85° C.×1000 hours
Moisture resistance: 85° C.×90% RH×1000 hours
Weather resistance: 83° C.×180 W/m²×50% RH×2000 hours Example 6

4915 g of the resin (a), 85 g of the impregnated pellets obtained in Example 4, 1 g of the antioxidant, 10 g of the ultraviolet absorber, and 3.5 g of the photo stabilizer were respectively weighed and mixed. This mixture was kneaded at 180° C. using an extruder (L/D=26, full flight screw, compression ratio 2.6), and thus a uniform sheet having a thickness of 0.4 mm was obtained. The sheet thus obtained was used to produce a sample in the same manner as in Example 5, and at the same time, a measurement of the adhesive strength and an evaluation of durability were performed. The results of the measurement and the evaluation are shown in the following Table 2.

Example 7

A sample was produced in the same manner as in Example 5, except that the resin (a) used in Example 5 was changed to resin (b), and a measurement of the adhesive strength and an evaluation of durability were also performed. The results of the measurement and the evaluation are shown in the following Table 2.

Example 8

A sample was produced in the same manner as in Example 5, except that the resin (a) used in Example 5 was changed to resin (f), and the amount of the silane coupling agent (a) was changed from 10 g to 20 g, and a measurement of the adhesive strength and an evaluation of durability were also performed. The results of the measurement and the evaluation are shown in the following Table 2.

Comparative Example 12

A sample was produced in the same manner as in Example 5, except that the resin (a) used in Example 5 was changed to resin (c), and a measurement of the adhesive strength and an evaluation of durability were also performed. The results of the measurement and the evaluation are shown in the following Table 2.

TABLE 1

|  |  |  | Silane coupling agent | | |
| --- | --- | --- | --- | --- | --- |
|  | Resin | Type | Added amount (*1) | Torque Change ΔN and Observation | Adhesiveness to Glass [N/10 mm] |
| Example 1 | Resin (a) | Silane coupling agent (a) | 1 part | 100% | 74/Sheet break |
| Example 2 | Resin (b) | Silane coupling agent (a) | 1 part | 103% | 61/Sheet break |
| Comparative Example 1 | Resin (a) | Silane coupling agent (b) | 1 part | 168%, Gelled | Sheet not formed |

TABLE 1-continued

| | Resin | Silane coupling agent Type | Added amount (*1) | Torque Change ΔN and Observation | Adhesiveness to Glass [N/10 mm] |
|---|---|---|---|---|---|
| Comparative Example 2 | Resin (a) | Silane coupling agent (c) | 1 part | 192%, Gelled | Sheet not formed |
| Comparative Example 3 | Resin (a) | Silane coupling agent (d) | 1 part | 186%, Gelled | Sheet not formed |
| Comparative Example 4 | Resin (a) | Silane coupling agent (e) | 1 part | 236%, Gelled | Sheet not formed |
| Comparative Example 5 | Resin (b) | Silane coupling agent (c) | 1 part | 255%, Gelled | Sheet not formed |
| Comparative Example 6 | Resin (c) | Silane coupling agent (c) | 1 part | 239%, Gelled | Sheet not formed |
| Comparative Example 7 | Resin (c) | Silane coupling agent (a) | 1 part | 144% | 70/Sheet break |
| Comparative Example 8 | Resin (d) | Silane coupling agent (c) | 1 part | 232%, Gelled | Sheet not formed |
| Comparative Example 9 | Resin (d) | Silane coupling agent (a) | 1 part | 169% | 89/Sheet break |
| Comparative Example 10 | Resin (e) | Silane coupling agent (c) | 1 part | 220%, Gelled | Sheet not formed |
| Comparative Example 11 | Resin (e) | Silane coupling agent (a) | 1 part | 133%, Gelled | Sheet not formed |
| Example 3 | Resin (a) | Silane coupling agent (a) | 43 parts | 114% | 55/Sheet break |

(*1): Added amount based on 100 parts of the resin

TABLE 2

| | Processing Temperature 130° C. | Processing Temperature 180° C. | Resin | Silane coupling agent Type | Silane coupling agent Added amount [parts] | Adhesiveness between sealing sheet and glass [N/10 mm] | Adhesiveness between sealing sheet and back sheet [N/10 mm] |
|---|---|---|---|---|---|---|---|
| Example 5 | — | Stable | (a) | (a) | 0.2 | >40 | >10 (Base material destroyed) |
| Example 6 | — | Stable | (a) | (a) | 0.2 | >40 | >10 (Base material destroyed) |
| Example 7 | — | Stable | (b) | (a) | 0.2 | >40 | >10 (Base material destroyed) |
| Example 8 | — | Stable | (f) | (a) | 0.4 | 30 | >10 (Base material destroyed) |
| Comparative Example 12 | Gel generated | — | (c) | (a) | 0.2 | — | — |

| | Durability Evaluation | | | | | |
|---|---|---|---|---|---|---|
| | Heat resistance | | Moisture resistance | | Weather resistance | |
| | Initial value (YI) | After lapse of 1000 h (YI) | Initial value (YI) | After lapse of 1000 h (YI) | Initial value (YI) | After lapse of 2000 h (YI) |
| Example 5 | 0.95 | 0.69 | 1.07 | 4.33 | 0.89 | 3.34 |
| Example 6 | −2.88 | −2.49 | −2.87 | −0.67 | −3.00 | −2.10 |
| Example 7 | 2.87 | −0.99 | 2.75 | 0.94 | 2.80 | 2.80 |
| Example 8 | 1.58 | 0.51 | 1.67 | 2.53 | 1.55 | 7.33 |
| Comparative Example 12 | — | — | — | — | — | — |

As shown in the Table 1, in the Examples, a gelled state was not observed in the resin composition for sheet molding, and the production of the sheet and the production of the solar cell module could be performed in a stable manner, while high values were exhibited for the adhesiveness to glass. Furthermore, as shown in the Table 2, the Examples had high adhesiveness to the back sheet, small changes in the YI which exhibits the degree of yellowing, and good durability to heat, moisture and light.

On the other hand, in the Comparative Examples, a large increase in the viscosity was seen during kneading, and a gelled state was visually recognized. When the resin compositions were adhered to glass, the adhesive strength was also deteriorated. Furthermore, in the Comparative Examples, since the resin compositions were gelled during the kneading processing, the resin compositions could not be made into sheets.

The above Examples were explained based on the instances of using N-2-(aminoethyl)-3-aminopropylmethyldimethoxysilane as the dialkoxysilane having an amino group, but the invention is not limited to these. And, on the instances of using other N-2-(aminoethyl)-3-aminopropylalkyldialkoxysilanes, the same effects as in the Examples may be also obtained. Furthermore, when the previously described other "dialkoxysilane having an amino group" other than the N-2-(aminoethyl)-3-aminopropylalkyldialkoxysilane is used in combination with an ethylene-(meth)acrylic acid copolymer, the same effects as in the Examples may be obtained.

The entire disclosure of Japanese Patent Application No. 2008-161494 is incorporated herein into this specification by reference.

All documents, patent applications and technical specifications recited in this specification are incorporated herein by reference in this specification to the same extent as if each individual publication, patent applications and technical standard was specifically and individually indicated to be incorporated by reference.

The invention claimed is:

1. An ethylene copolymer composition comprising a zinc ionomer containing, as a main component, a copolymer having a constituent unit derived from ethylene, a constituent unit derived from (meth)acrylic acid, and a dialkoxysilane having an amino group, and a constituent unit derived from (meth)acrylic acid ester.

2. The ethylene copolymer composition according to claim 1, wherein the dialkoxysilane is at least one of 3-aminopropylalkyldialkoxysilane or N-2-(aminoethyl)-3-aminopropylalkyldialkoxysilane.

3. The ethylene copolymer composition according to claim 1, wherein the content ratio of the dialkoxysilane is 15 parts by mass or less based on 100 parts by mass of the zinc ionomer.

4. The ethylene copolymer composition according to claim 1, further comprising a weather resistance stabilizer selected from a group consist of an ultraviolet absorber, a photostabilizer or an antioxidant.

5. The ethylene copolymer composition according to claim 1, wherein a degree of neutralization of the zinc ionomer is from 10% to 60%.

6. The ethylene copolymer composition according to claim 1, wherein the content ratio of the constituent unit derived from (meth)acrylic acid is from 1% by mass to 25% by mass based on the total mass of the copolymer.

7. The ethylene copolymer composition according to claim 1, wherein the alkyl moiety of the dialkoxysilane has from 1 to 3 carbon atoms.

8. The ethylene copolymer composition according to claim 1, wherein a content ratio of the dialkoxysilane is from 0.03 parts by mass to 12 parts by mass based on 100 parts by mass of the zinc ionomer.

9. A sheet for sealing a solar cell element formed by using the ethylene copolymer composition according to claim 1.

10. A solar cell module comprising the sheet for sealing a solar cell element according to claim 9.

11. The ethylene copolymer composition according to claim 1, wherein the dialkoxysilane is 3-aminopropylalkyldialkoxysilane.

12. The ethylene copolymer composition according to claim 1, wherein the (meth)acrylic acid ester is n-butyl ester or isobutyl ester of acrylic acid or methacrylic acid.

13. The ethylene copolymer composition according to claim 1, wherein the (meth)acrylic acid ester is isobutyl ester of acrylic acid or methacrylic acid.

* * * * *